(12) United States Patent  
Suffern et al.

(10) Patent No.: US 7,843,683 B2
(45) Date of Patent: Nov. 30, 2010

(54) AIRFLOW BYPASS DAMPER

(75) Inventors: Edward S. Suffern, Chapel Hill, NC (US); Takeshi Wagatsuma, Yamato (JP); Kenji Hidaka, Yokohama (JP); Michihiro Okamoto, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 12/393,660

(22) Filed: Feb. 26, 2009

(65) Prior Publication Data

US 2010/0214733 A1    Aug. 26, 2010

(51) Int. Cl.
*H05K 7/20* (2006.01)
(52) U.S. Cl. .................... 361/679.46; 361/679.48; 361/679.49; 361/679.51; 361/695; 454/184
(58) Field of Classification Search ........... 361/679.01, 361/679.46, 679.47, 679.48, 690–697, 719–727, 361/730, 752, 818, 831; 454/183, 184, 333, 454/358; 165/80.3, 104.33, 122, 185; 312/223.2, 312/223.3, 308, 310, 321.5, 351.2, 336, 362; 174/481, 17 R, 50, 53, 56–58, 67, 559, 17 VA, 174/480
See application file for complete search history.

(56) References Cited

U.S. PATENT DOCUMENTS

| | | | |
|---|---|---|---|
| 4,972,218 A | | 11/1990 | Weissburb |
| 5,527,991 A | | 6/1996 | Sadowski et al. |
| 5,528,455 A | | 6/1996 | Miles |
| 6,058,011 A | * | 5/2000 | Hardt et al. .............. 361/694 |
| 6,688,965 B1 | | 2/2004 | Crippen et al. |
| 6,771,499 B2 | * | 8/2004 | Crippen et al. .......... 361/679.48 |
| 6,853,552 B2 | | 2/2005 | Brewer |
| 6,927,976 B1 | | 8/2005 | Malone et al. |
| 6,963,484 B2 | * | 11/2005 | Brooks et al. ................ 361/678 |
| 6,980,435 B2 | * | 12/2005 | Shum et al. .................. 361/695 |
| 7,344,439 B2 | | 3/2008 | Henry et al. |
| 7,416,481 B2 | | 8/2008 | Baker et al. |
| 7,432,441 B2 | * | 10/2008 | Liang ........................... 174/50 |
| 7,646,601 B2 | * | 1/2010 | Zhang et al. ................. 361/695 |
| 2003/0091433 A1 | | 5/2003 | Tam et al. |
| 2009/0161310 A1 | * | 6/2009 | Peng et al. ............. 361/679.46 |
| 2009/0168328 A1 | * | 7/2009 | Peng et al. ............. 361/679.46 |
| 2010/0073868 A1 | * | 3/2010 | Mayer et al. ........... 361/679.51 |

* cited by examiner

*Primary Examiner*—Michael V Datskovskiy
(74) *Attorney, Agent, or Firm*—Cynthia G. Seal; Jeffrey L. Streets

(57) ABSTRACT

Airflow bypass dampers made from a resilient material and systems including the resilient dampers. The dampers are secured in a chassis and extend into a deployed position to obstruct airflow through a component bay of a chassis in the absence of a component, such as a sever blade, within the selected bay. The airflow bypass damper bends into a retracted position in response to installing a component into the bay. It returns to its original shape and position when the component is removed. An air moving device moves air through a component installed in the chassis. A plurality of the resilient airflow bypass dampers may be secured in a plurality of bays of a chassis, each resilient damper moving independently of the others. The resilient material bends without permanent deformation. For example, the resilient material may include, without limitation, natural polymers, synthetic polymers and metals. A preferred damper has a curved cross-sectional shape.

20 Claims, 3 Drawing Sheets

AIRFLOW BYPASS DAMPER

BACKGROUND OF THE INVENTION

1. Field of the Invention

The present invention relates to dampers used to prevent airflow bypass in an empty bay of a computer chassis.

2. Background of the Related Art

A computer chassis is a housing that contains various components of a computer system. Computer systems having replaceable or hot swappable components, the computer chassis may include a plurality of slots or bays for conveniently receiving and securing components. A notable example of such a computer system is a server blade system having a chassis that is equipped with a plurality of bays for receiving blade servers. The chassis may also include an air moving device, such as a group of fans, for moving air through each of the blade servers that are installed in the chassis. Because this airflow is responsible for cooling each blade server in the chassis, as well as other components of the chassis, the airflow must be distributed reliably among the blade servers.

When one of the blade servers is removed from a bay in the chassis, the airflow may channel through the empty bay and result in less airflow through the blade servers that are still installed in the chassis. This situation causes a loss of cooling efficiency and may allow components within the installed blade servers to over heat. As a result, some blade server chassis include an air bypass damper in each bay to ensure that airflow patterns remain distributed across all blade servers.

U.S. Pat. No. 6,771,499 discloses an airflow bypass damper including a rigid damper plate that is secured inside the chassis along one edge of the bay using a hinge. A torsion spring is used in combination with the hinge so that the damper plate is biased to extend across the bay and obstruct airflow. When, a blade server is inserted into the bay, the blade server engages the damper plate and causes the damper plate to rotate out of the path of the blade server.

BRIEF SUMMARY OF THE INVENTION

One embodiment of the present invention provides a system comprising a chassis including a component bay, wherein a component can be installed into the bay, and an air moving device for moving air through the component bay. The system further comprises an airflow bypass damper secured to the chassis and disposed to extend into the bay. The airflow bypass damper is selectively moveable between first and second positions, wherein the airflow bypass damper is a resilient material that extends into the first position to obstruct airflow through the bay in the absence of a server blade within the selected bay. The airflow bypass damper bends into the second position in response to installing a server blade into the bay.

Another embodiment of the present invention provides a system for use with a plurality of component modules, wherein each component module has at least one air flow passage therethrough. The system comprises a chassis including a plurality of bays, wherein one of the plurality of component modules can be installed into each of the bays, and an air moving device for moving air through each component module installed in the chassis. In addition, a plurality of airflow bypass dampers are provided, each airflow bypass damper being secured to the chassis and disposed to extend into a selected one of the plurality of bays. Each airflow bypass damper is selectively moveable between first and second positions, made from a resilient material that extends into the first position to obstruct airflow through the selected bay in the absence of a component module within the selected bay, and bends into the second position in response to installing a component module into the selected bay.

A further embodiment of the invention provides a server blade system for use with a plurality of server blades, wherein each server blade has at least one air flow passage therethrough. The server blade system comprises a chassis including a plurality of bays, wherein a server blade can be installed into each of the bays, and an air moving device for moving air through each server blade installed in the chassis. The server blade system further comprises a plurality of airflow bypass dampers, wherein each airflow bypass damper being secured to the chassis and disposed to extend into a selected one of the plurality of bays. Each airflow bypass damper is selectively moveable between first and second positions, made of a resilient material that extends into the first position to obstruct airflow through the selected bay in the absence of a server blade within the selected bay, and bends into the second position in response to installing a server blade into the selected bay.

DETAILED DESCRIPTION OF THE INVENTION

Figure 1:
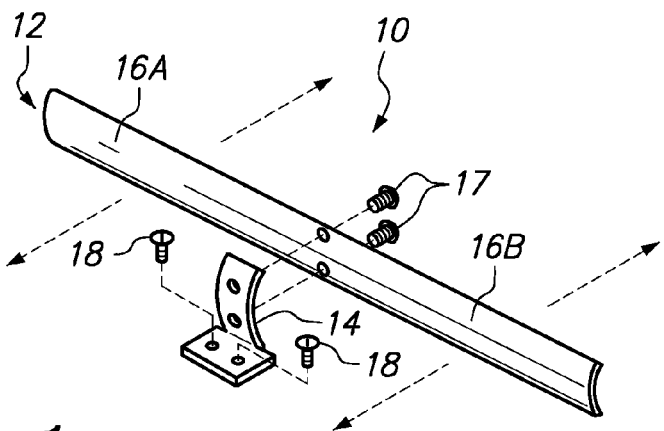
FIG. 1 is a perspective view of an elongate slat of a resilient material being secured to a bracket to form an assembly including two resilient airflow bypass dampers.

One embodiment of the present invention provides a system comprising a chassis including a component bay, wherein a component can be installed into the bay, and an air moving device for moving air through the component bay. The system further comprises an airflow bypass damper secured to the chassis and disposed to extend into the bay. The airflow bypass damper is selectively moveable between first and second positions, wherein the airflow bypass damper is a resilient material that extends into the first position to obstruct airflow through the bay in the absence of a server blade within the selected bay. The airflow bypass damper bends into the second position in response to installing a server blade into the bay.

Another embodiment of the present invention provides a system for use with a plurality of component modules, wherein each component module has at least one air flow passage therethrough. The system comprises a chassis including a plurality of bays, wherein one of the plurality of component modules can be installed into each of the bays, and an air moving device for moving air through each component module installed in the chassis. In addition, a plurality of airflow bypass dampers are provided, each airflow bypass damper being secured to the chassis and disposed to extend into a selected one of the plurality of bays. Each airflow bypass damper is selectively moveable between first and second positions, made from a resilient material that extends into the first position to obstruct airflow through the selected bay in the absence of a component module within the selected bay, and bends into the second position in response to installing a component module into the selected bay.

A further embodiment of the invention provides a server blade system for use with a plurality of server blades, wherein each server blade has at least one air flow passage there through. The server blade system comprises a chassis including a plurality of bays, wherein a server blade can be installed into each of the bays, and an air moving device for moving air through each server blade installed in the chassis. The server blade system further comprises a plurality of airflow bypass dampers, wherein each airflow bypass damper being secured to the chassis and disposed to extend into a selected one of the plurality of bays. Each airflow bypass damper is selectively moveable between first and second positions, made of a resilient material that extends into the first position to obstruct airflow through the selected bay in the absence of a server blade within the selected bay, and bends into the second position in response to installing a server blade into the selected bay.

The damper includes, or is made from, a resilient material that will bend without permanent deformation when a mechanical force is applied and will recover its shape when the mechanical force is removed. The resilient material may include, without limitation, natural polymers, synthetic polymers and metals. Furthermore, the resilient material will bend at or near the point where the damper is secured to the chassis. Accordingly, the damper to swing to the side of the bay where it will not interfere with the installation of the component module, which may be a server blade. In a preferred embodiment, the entire damper is made from a single piece of a resilient material, such as spring steel.

In addition to the damper material, the cross-sectional shape of the damper is relevant to the stiffness of the damper and the amount of force necessary to effect bending of the damper. For example, a damper with a curved cross-sectional shape will have a stiffness that is affected by the degree of curvature. Accordingly, various combinations of resilient materials, and cross-sectional shapes and dimensions may be implemented to provide a damper that will extend across the bay, yet bend to the side of the bay when engaged by a component is being installed in the bay. The damper should have an overall dimension that obstructs substantially all airflow through the bay. However, the length and width of the damper should not interfere with the bending of the damper or extend into an adjacent bay.

In another embodiment, the damper is an elongate metal sheet having a curved cross-section that provides stiffness to the sheet. Under a lateral force, the damper will bend. As a component proceeds into the bay, the component will engage the damper near the proximal end to cause bending to be localized between the point of engagement and the point where the damper is secured. The curved metal slat will tend to flatten out where it bends, allowing additional bending with little force. The curved metal slat may be heat treated to achieve the desired flexural characteristics to withstand repeated flattening operations that occur when the slat bends. To prevent excessive stress in the damper at the point of the bend, the curvature of the slat should be no greater than necessary to assure the full extension of the damper, even when air is flowing through the chassis.

In yet another embodiment, a plurality of the dampers is disposed in an array that extends across a plurality of bays. Optionally, the plurality of dampers is secured in a common assembly.

FIG. 1 is a perspective view of an elongated slat 12 of a resilient material being secured to a bracket 14 to form an assembly 10 including two resilient airflow bypass dampers 16A/B. The slat 12 is made from a resilient material that is sufficient stiff to support its own weight as it extends from the bracket 14 across an empty component bay. The slat 12 must also be able to remain in the extended position against the forces imposed by an air moving device, such that the slat 12 obstructs airflow. The resilient material of the slat 12 has a curved cross-section along its length to strengthen the slat without increasing its mass. Furthermore, the curved slat 12 is able to bend sharply without permanent deformation in order to move out of the path of a component being installed into the component bay. The slat 12 may be secured to the bracket 14 with a first pair of screws 17, and the bracket 14 may be secured to a chassis with a second pair of screws 18. Other fasteners and fastening processes may be used, and the bracket type and shape may be varied to accommodate different chassis and bay configurations.

Figure 2:
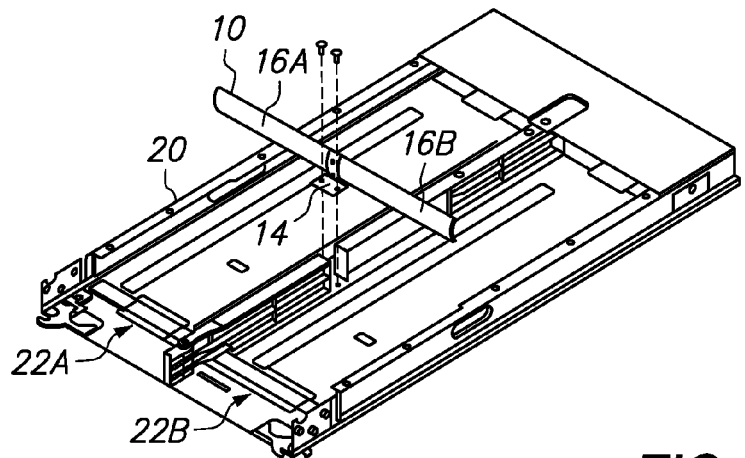
FIG. 2 is a perspective view of the resilient dampers being secured across two module bays in a blade chassis.

FIG. 2 is a perspective view of the assembly 10 being secured into a chassis 20 with the airflow bypass dampers 16A/B extending across two module bays 22 in a single server blade slot for a blade chassis. The bracket 14 is being secured with screws to the floor of the chassis 20 between the two bays 22. As shown, the convex face of the dampers is forwardly directed to obstruct airflow. However, it should be recognized that the dampers may be secured with the concave face being forwardly directed, although the amount of force required to bend the damper may be different.

Figure 3:
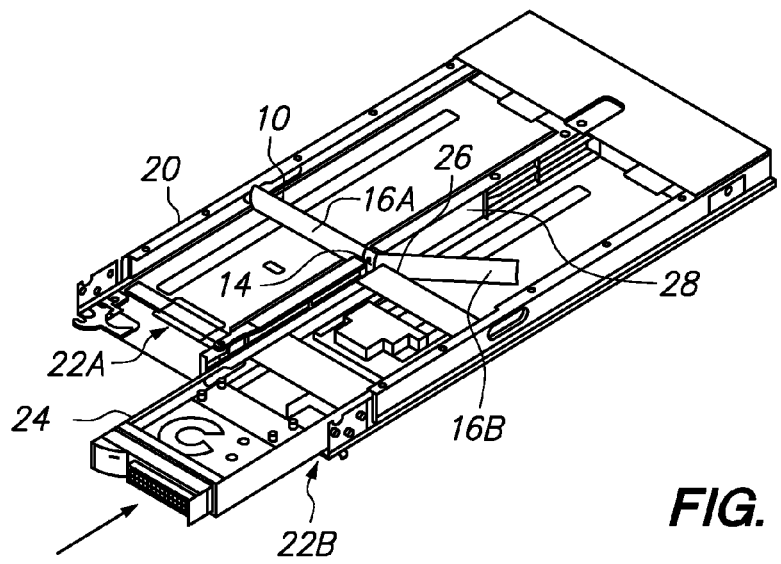
FIG. 3 is a perspective view of the blade chassis of FIG. 2 with a module being installed in the module bay and pushing the resilient damper to the side of the module bay.

FIG. 3 is a perspective view of the blade chassis 20 of FIG. 2 with a module 24 being installed in the module bay 22B and pushing the resilient damper 16B to the side of the module bay. As shown, the module 24 has been partially inserted into the bay 22B and a front corner 26 has engaged the damper 16B. As a result, the damper has begun to bend at a point between the point of engagement (at front corner 16) and the bracket 14. As the module 24 continues to be inserted to an installed position within the bay 22B, the damper 16B will bend further and be pushed to the side of the bay 22B where it will not interfere with the installation or removal of the module 24. Although the damper 16B is thin, a recess 28 is formed in the sidewall of the bay 22B to receive the damper 16B. The two dampers 16A/B operate independently in response to the absence or presence of an installed module. The resilience of the material and configuration of the dampers 16A/B cause them to passively and automatically obstruct airflow when no modules is installed, yet passively and automatically retract during the installation of a component module. It should be appreciated that no coil spring or other type of external spring is necessary to the operation of the damper. When the module 24 is removed, the damper 16 returns to its original position, obstructing airflow through the bay 22B.

Figure 4:
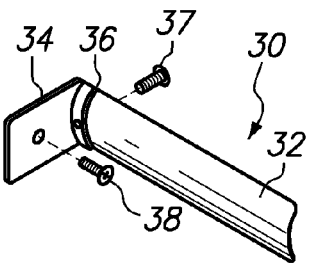
FIG. 4 is a perspective view of a resilient damper secured to a bracket at one end to form a single resilient damper.

FIG. 4 is a perspective view of an assembly 30 including a single resilient damper 32 secured to a bracket 34 at one end 36 of the damper. The damper 32 is an elongate slat having a curved cross-section along its length. The end 36 of the damper 32 is secured to the bracket 34 with a screw 37 and the bracket may be secured to a chassis using a screw 38. As shown, the bracket 34 allows the damper 32 to extend perpendicular from a chassis wall, whereas the bracket 14 of FIGS. 1-3 allows the dampers 16A/B to extend parallel to a chassis wall.

Figure 5A:
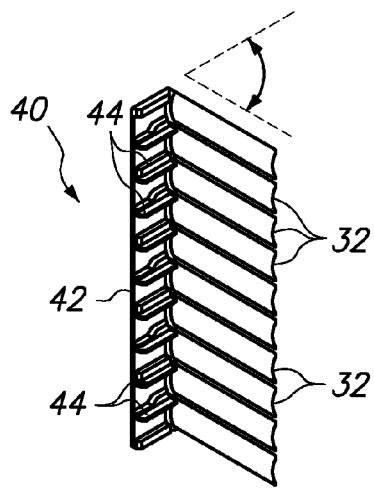
FIGS. 5A-5B are front and back perspective views of a damper assembly including a series of ten adjacent resilient dampers secured to a common base bracket.
Figure 5B:
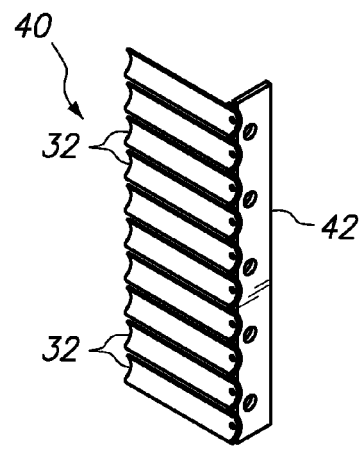

FIGS. 5A-5B are front and back perspective views, respectively, of a damper assembly 40 including a series of ten adjacent resilient dampers 32 secured to a common base bracket 42. The width and length of each damper 32 are selected to obstruct airflow through a component bay. A slight space between each adjacent damper allows the dampers 32 to operate independently. The base bracket 42 includes optional guides 44 that help maintain alignment of a module as it is being installed to a bay.

Figure 6:
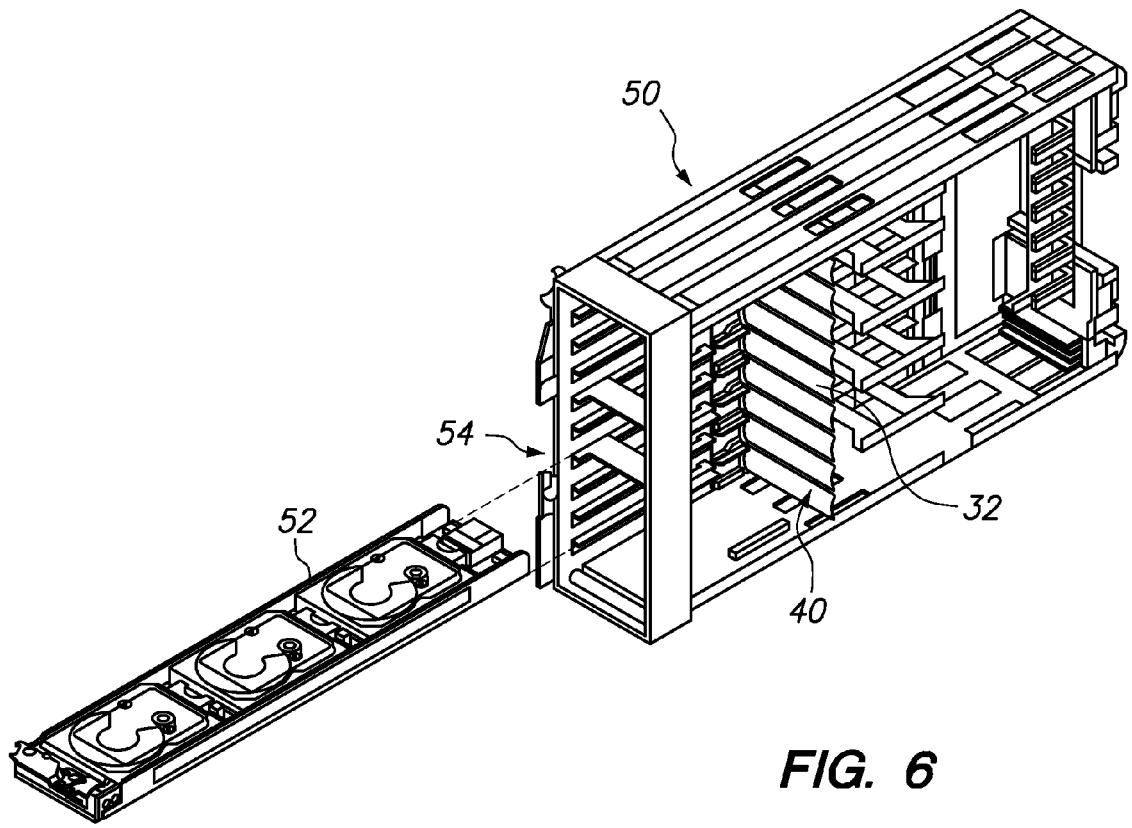
FIG. 6 is a perspective view of a 3 U blade chassis with a module being installed in the module bay.

FIG. 6 is a perspective view of a 3 U wide server blade for a blade chassis 50 with a module 52 being installed in one of ten module bays 54. The module 52 will enter a bay 54 and engage a damper 32, which is part of the damper assembly 40 that has been secured to the chassis 50. As shown, each of the ten dampers 32 are extending across one of the bays 54 formed in the chassis 50 in a position that obstructs airflow through the respective bay. However, each damper 32 will operate independently to bend upon installation of a module 52.

Figure 7:
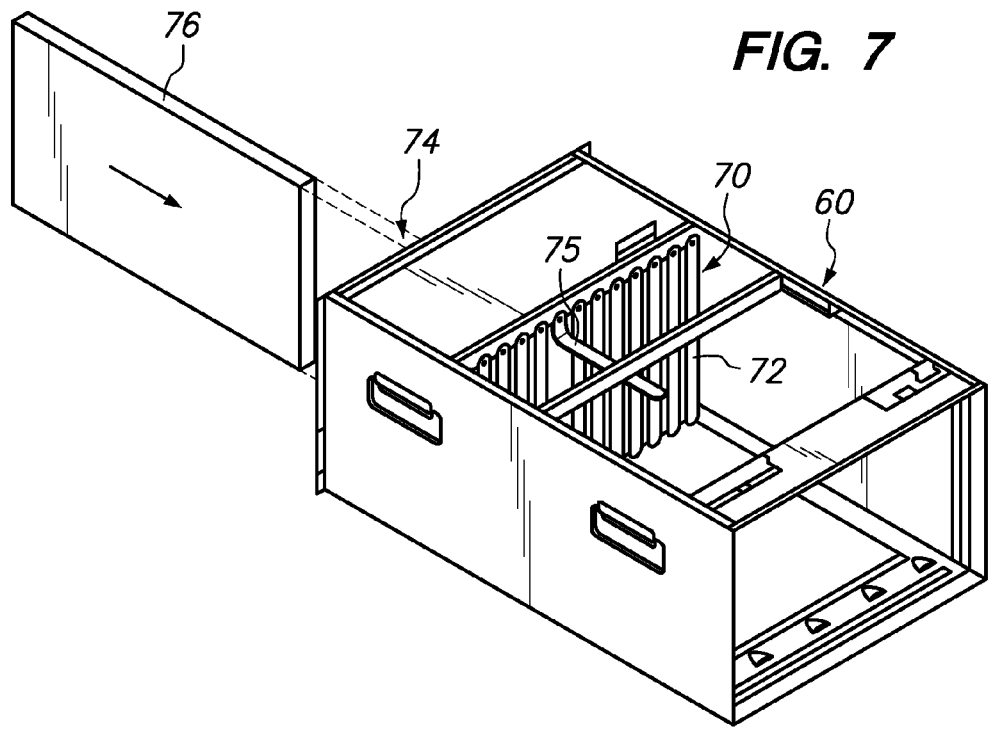
FIG. 7 is a perspective view of a chassis having a combined width of 12 U and a damper assembly providing twelve resilient dampers.

FIG. 7 is a perspective view of a chassis 60 having a combined width of 12 U and a damper assembly 70 providing twelve resilient dampers 72. The damper assembly 70 is similar to the damper assembly 40 of FIGS. 5A/B, except that the individual dampers 72 are longer and wider to match the dimensions of the bay 74 that will receive a server blade 76. During installation of the server blade 76 in the bay 74, the server blade 76 will engage the damper (such as damper 75) causing the damper to bend out of the way of the server blade. It should be appreciated through the embodiments of FIGS. 3, 6 and 7, that the dampers of the present invention are not limited to a particular size of bay, configuration of bays within the chassis, or the nature of the chassis and component being installed therein.

Figure 8A:
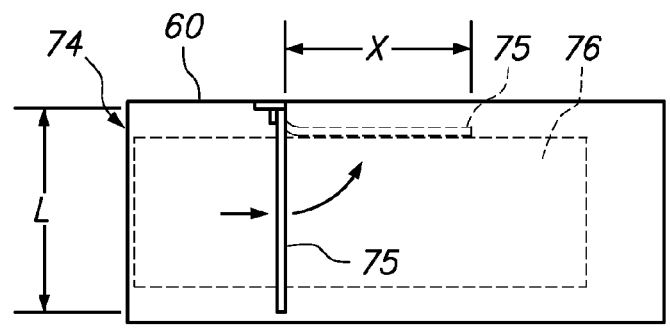
FIG. 8A is a schematic side view of a single damper spanning a full dimension of a bay.

FIG. 8A is a schematic side view of a single damper 75 spanning a full dimension of a bay 74. When a server blade 76 (shown in dashed lines) is installed, the bent or retracted damper 75 (shown in dashed lines) extends rearward (in the direction of server blade insertion) within the chassis. The retracted damper 75 (dashed lines) extends rearwardly over a distance (X) that is about the same as the distance (L) that the deployed damper 75 (solid lines) extends across the bay 74.

Figure 8B:
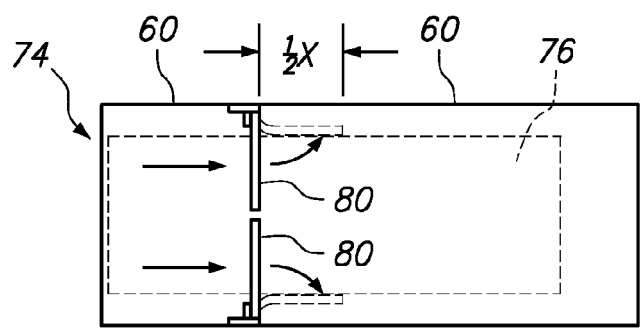
FIG. 8B is a schematic side view of a pair of opposing dampers that each span half the dimension of a bay to obstruct airflow through a bay with only half the throw.

FIG. 8B is a schematic side view of a pair of opposing dampers 80 that each span half the vertical dimension of the bay 74 to obstruct airflow through the bay. However, the shorter length of the individual dampers 80 means that the dampers will extend rearwardly a shorter distance (½ X). Although this installation may double the part count, this configuration may be beneficial in circumstances where the long damper (of length X) would interfere with other functions of the chassis.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
a chassis including a component bay, wherein a component can be installed into the bay;
an air moving device for moving air through the component bay; and
an airflow bypass damper has a first end secured to the chassis, wherein the airflow bypass damper is disposed to extend into the bay, the airflow bypass damper being selectively moveable between first and second positions, wherein the airflow bypass damper is a resilient material that extends into the first position to obstruct airflow through the bay in the absence of a server blade within the selected bay, wherein the airflow bypass damper bends into the second position in response to installing a server blade into the bay, and wherein the airflow bypass damper forms a slat having a curved lateral cross-section along its length from the first end.

2. The system of claim 1, wherein the resilient material is spring steel.

3. The system of claim 1, wherein the resilient material includes a polymer.

4. The system of claim 1, wherein the airflow bypass damper has a convex face directed upstream into an airflow path.

5. The system of claim 1, wherein the airflow bypass damper has convex face directed toward the front of the selected bay.

6. The system of claim 1, wherein the airflow bypass damper has a concave face directed upstream into an airflow path.

7. The system of claim 1, wherein the airflow bypass damper has a concave face directed toward the front of the selected bay.

8. The system of claim 1, wherein the airflow bypass damper is secured to the chassis using a bracket.

9. The system of claim 1, wherein each airflow bypass damper has convex face directed toward the front of the selected bay.

10. The system of claim 1, wherein each airflow bypass damper has a concave face directed toward the front of the selected bay.

11. The system of claim 1, wherein the airflow bypass damper is characterized by bending sharply at a point between the first end of the slat and a point of engagement with the server blade.

12. The system of claim 1, wherein the airflow bypass damper extends perpendicular from a wall of the chassis.

13. A system for use with a plurality of component modules, wherein each component module has at least one air flow passage therethrough, the system comprising:
- a chassis including a plurality of bays, wherein one of the plurality of component modules can be installed into each of the bays;
- an air moving device for moving air through each component module installed in the chassis; and
- a plurality of airflow bypass dampers, each airflow bypass damper having a first end secured to the chassis, wherein the airflow bypass damper is disposed to extend into a selected one of the plurality of bays, wherein each airflow bypass damper is selectively moveable between first and second positions, wherein each airflow bypass damper is made from a resilient material that extends into the first position to obstruct airflow through the selected bay in the absence of a component module within the selected bay, wherein each airflow bypass damper bends into the second position in response to installing a component module into the selected bay, and wherein the airflow bypass damper forms a slat having a curved lateral cross-section along its length from the first end.

14. The system of claim 13, wherein the resilient material is spring steel.

15. The system of claim 13, wherein the resilient material includes a polymer.

16. The system of claim 13, wherein each airflow bypass damper is secured to the chassis using a bracket.

17. The system of claim 13, wherein each airflow bypass damper is secured to the chassis using a single bracket.

18. The system of claim 13, wherein the airflow bypass damper is characterized by bending sharply at a point between the first end of the slat and a point of engagement with the component module.

19. The system of claim 13, wherein the airflow bypass damper extends perpendicular from a wall of the chassis.

20. The system of claim 13, wherein the plurality of component modules includes a plurality of server blades.

* * * * *